(12) United States Patent
Zhou et al.

(10) Patent No.: US 10,340,274 B2
(45) Date of Patent: Jul. 2, 2019

(54) LDMOS FINFET DEVICE

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventors: Fei Zhou, Shanghai (CN); Zhongshan Hong, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 3 days.

(21) Appl. No.: 15/473,183

(22) Filed: Mar. 29, 2017

(65) Prior Publication Data
US 2017/0365603 A1 Dec. 21, 2017

(30) Foreign Application Priority Data

Jun. 15, 2016 (CN) .......................... 2016 1 0424198

(51) Int. Cl.
*H01L 29/66* (2006.01)
*H01L 27/092* (2006.01)
(Continued)

(52) U.S. Cl.
CPC .... *H01L 27/0924* (2013.01); *H01L 21/31051* (2013.01); *H01L 21/32115* (2013.01);
(Continued)

(58) Field of Classification Search
USPC .......... 257/20, 194, 135–136, 213–413, 900, 257/902–903
See application file for complete search history.

(56) References Cited

U.S. PATENT DOCUMENTS

| 9,281,379 B1 | 3/2016 | Campi, Jr. et al. |
| 2012/0104509 A1* | 5/2012 | Matsumoto ..... H01L 21/823814 257/369 |

(Continued)

OTHER PUBLICATIONS

European Application No. 17174819.7, Extended European Search Report dated Nov. 9, 2017, 9 pages.

*Primary Examiner* — Moin M Rahman
(74) *Attorney, Agent, or Firm* — Kilpatrick Townsend & Stockton LLP

(57) ABSTRACT

A method of manufacturing a semiconductor device is provided. The semiconductor device includes a semiconductor substrate, first and second fins on the semiconductor substrate and separated by a trench. The first fin includes a first portion having a first conductivity type and a second portion having a second conductivity type different from the first conductivity type, the first and second portions are adjacent to each other, and the second portion connected to the second fin through the semiconductor substrate. The semiconductor device also includes a gate structure on the first and second portions and including a gate insulator layer on the first and second portions, a gate on a portion of the gate insulator layer on the first portion, and a dummy gate on the second portion and including an insulating layer or an undoped semiconductor layer and adjacent to the gate.

20 Claims, 7 Drawing Sheets

(51) Int. Cl.
- *H01L 29/49* (2006.01)
- *H01L 29/78* (2006.01)
- *H01L 29/06* (2006.01)
- *H01L 29/08* (2006.01)
- *H01L 29/10* (2006.01)
- *H01L 21/3105* (2006.01)
- *H01L 21/321* (2006.01)
- *H01L 21/8238* (2006.01)
- *H01L 27/02* (2006.01)
- *H01L 21/28* (2006.01)

(52) U.S. Cl.
CPC ......... *H01L 21/823821* (2013.01); *H01L 21/823828* (2013.01); *H01L 27/0207* (2013.01); *H01L 29/0649* (2013.01); *H01L 29/0653* (2013.01); *H01L 29/0657* (2013.01); *H01L 29/0882* (2013.01); *H01L 29/1037* (2013.01); *H01L 29/4966* (2013.01); *H01L 29/4983* (2013.01); *H01L 29/66545* (2013.01); *H01L 29/66659* (2013.01); *H01L 29/66681* (2013.01); *H01L 29/66689* (2013.01); *H01L 29/785* (2013.01); *H01L 29/7816* (2013.01); *H01L 29/7835* (2013.01); *H01L 21/28088* (2013.01)

(56) References Cited

U.S. PATENT DOCUMENTS

| | | | |
|---|---|---|---|
| 2015/0357462 A1* | 12/2015 | Ponoth | H01L 29/66681 257/329 |
| 2016/0093536 A1* | 3/2016 | Yang | H01L 29/66545 257/392 |
| 2016/0093730 A1 | 3/2016 | Li | |
| 2016/0163850 A1* | 6/2016 | Liu | H01L 29/785 257/338 |
| 2017/0018551 A1* | 1/2017 | Ponoth | H01L 27/0924 |

* cited by examiner

LDMOS FINFET DEVICE

CROSS-REFERENCES TO RELATED APPLICATIONS

The present application claims priority to Chinese patent application No. 201610424198.5, filed with the State Intellectual Property Office of People's Republic of China on Jun. 15, 2016, the content of which is incorporated herein by reference in its entirety.

FIELD OF THE INVENTION

The present invention relates to integrated semiconductor devices, and more particularly to methods for manufacturing a fin-type field effect transistor device and the fin-type field effect transistor device manufactured using the methods.

BACKGROUND OF THE INVENTION

As the critical dimension of metal oxide semiconductor field effect transistor (MOSFET) devices continues to shrink, the short channel effect becomes more problematic. Fin field effect transistor (FinFET) devices have good control capability of gates to effectively suppress the short channel effect. FinFET devices can also reduce random dopant fluctuation to improve the stability of the devices. Thus, FinFET devices are widely used in the design of small-sized semiconductor elements.

Laterally Diffused Metal Oxide Semiconductor (LDMOS) devices are one of the important components for developing cost-effective system-on-a-chip applications.

The present inventors discovered that, in a conventional LDMOS device, a portion of a gate oxide and a portion of a metal gate are disposed on a shallow trench isolation (STI) region, the portion of the gate oxide on the STI region is also disposed between the metal gate and a drift region. In operation, the voltage difference between the metal gate and the drift region would tend to cause breakdown (puncture) to the gate oxide, thereby limiting the source and drain breakdown performance of an LDMOS device.

Therefore, there is a need for improved LDMOS device structures and methods for manufacturing such semiconductor devices to overcome these drawbacks.

BRIEF SUMMARY OF THE INVENTION

The present inventors discovered that, in a conventional LDMOS device, a portion of a gate oxide and a portion of a metal gate are disposed on a shallow trench isolation (STI) region, the portion of the gate oxide on the STI region is also disposed between the metal gate and a drift region. During operation, the voltage difference between the metal gate and the drift region would tend to cause breakdown (puncture) to that portion of the gate oxide, limiting the source and drain breakdown performance of the LDMOS (especially LDNMOS) device.

Embodiments of the present invention provide a semiconductor device and method of manufacturing the same that have enhanced source and drain breakdown performance.

In accordance to the present invention, the semiconductor device may include a semiconductor substrate, and first and second fins on the semiconductor substrate and separated by a trench. The first fin includes a first portion having a first conductivity type and a second portion having a second conductivity type different from the first conductivity type, the first and second portions are adjacent to each other, and the second portion is connected to the second fin through the semiconductor substrate. The semiconductor device may also include a gate structure on the first and second portions. The gate structure may include a gate insulator layer on the first and second portions; a gate on a portion of the gate insulator layer on the first portion and a dummy gate on the second portion and comprising an insulating layer or an undoped semiconductor layer, the dummy gate is adjacent to the gate.

In one embodiment, the dummy gate includes undoped polycrystalline or amorphous silicon. In one embodiment, a lateral distance between the dummy gate and a closest edge of the first portion is in a range between 0 nm and 100 nm.

In one embodiment, the first portion has an upper surface that is flush with an upper surface of the second portion.

In one embodiment, the semiconductor substrate includes a first region having the first conductivity type and a second region having the second conductivity type, the first fin is on the first region, and the second fin is on the second region.

In one embodiment, the first fin further includes a third portion having the first conductivity type on the first region, the third portion is adjacent to the first portion and has an upper surface lower than upper surface of the first portion, the gate insulator layer is on a portion of the third portion, and the gate is on a portion of the gate insulator layer on the third portion.

In one embodiment, the semiconductor device further includes a first insulator layer filling at least a portion of the trench. The gate structure has a first end on the third portion and a second end on the first insulator layer. The gate structure further includes a hard mask layer having a first portion on a side surface of the gate on the third portion and a second portion on a side surface of the dummy gate on the first insulator layer.

In one embodiment, the semiconductor device further includes a source on the third portion and a drain on the second fin. The first portion of the hardmask layer is disposed between the source and the gate and the second portion of the hardmask layer is disposed between the drain and the dummy gate.

In one embodiment, the gate includes a work function adjusting layer on a portion of the gate insulator layer and a conductive material layer on the work function adjusting layer.

In one embodiment, in the case where the first conductivity type is P-type, the second conductivity type is N-type, the work function adjusting layer is an N-type work function adjusting layer. In the case where the first conductivity type is N-type, the second conductivity type is P-type, the work function adjusting layer is a P-type work function adjusting layer.

In one embodiment, the N-type work function adjusting layer includes a titanium aluminum alloy; the P-type work function adjusting layer includes titanium nitrite or tantalum nitride.

In one embodiment, the semiconductor device further includes an interlayer dielectric layer surrounding the gate structure and covering the source and drain.

Embodiments of the present invention also provide a method of manufacturing a semiconductor. The method may include providing a semiconductor structure comprising a semiconductor substrate, first and second fins on the semiconductor substrate and separated by a trench, the first fin comprising a first portion including a first conductivity type and a second portion including a second conductivity type different from the first conductivity type, the first and second portions adjacent to each other, the second portion connected to the second fin through the semiconductor substrate. The method also includes forming a dummy gate structure on the first and second portions, the dummy gate structure comprising a gate insulator layer on the first portion and the second portion, a dummy gate on the gate insulator layer, and a hardmask layer on the dummy gate, forming an interlayer dielectric layer on the semiconductor structure, planarizing the interlayer dielectric layer and the hardmask layer to expose the dummy gate, removing a portion of the dummy gate on the first portion to expose a portion of the gate insulator layer while retaining a portion of the dummy gate on the second portion, and forming a gate on the exposed portion of the gate insulator layer. The gate is adjacent to the retained portion of the dummy gate.

In one embodiment, the first fin further includes a third portion having the first conductivity type adjacent to the first portion and having an upper surface lower than an upper surface of the first portion, and forming the dummy gate comprises forming the gate insulator layer on the third portion, and the dummy gate is formed on a portion of the gate insulator layer on the third portion.

In one embodiment, removing the portion of the dummy gate includes removing a portion of the dummy gate on the third portion.

In one embodiment, the method also includes, prior to forming the interlayer dielectric layer, forming a source on a portion of the third portion that is not covered by the dummy gate structure and a drain on the second fin.

In one embodiment, the method further includes filling at least a portion of the trench with a first insulating layer, and the dummy gate structure includes a first end on the third portion and a second end on the first insulating layer.

In one embodiment, removing the portion of the dummy gate on the first portion includes forming a patterned first mask layer on a portion of the interlayer dielectric layer and the dummy gate exposing a portion of the dummy gate on the first portion, removing the exposed portion of the dummy gate using the patterned first mask layer as a mask, and removing the first mask layer.

In one embodiment, forming the gate includes forming a work function adjusting layer on the interlayer dielectric layer, a portion of an inner wall of the hardmask layer, a portion of the gate insulator layer, and a portion of the dummy gate on the second portion, forming a conductive material layer on the work function adjusting layer, and planarizing the conductive material layer to expose a surface of the interlayer dielectric layer.

The following detailed description together with the accompanying drawings will provide a better understanding of the nature and advantages of the present invention.

DETAILED DESCRIPTION OF THE INVENTION

Figure 1:
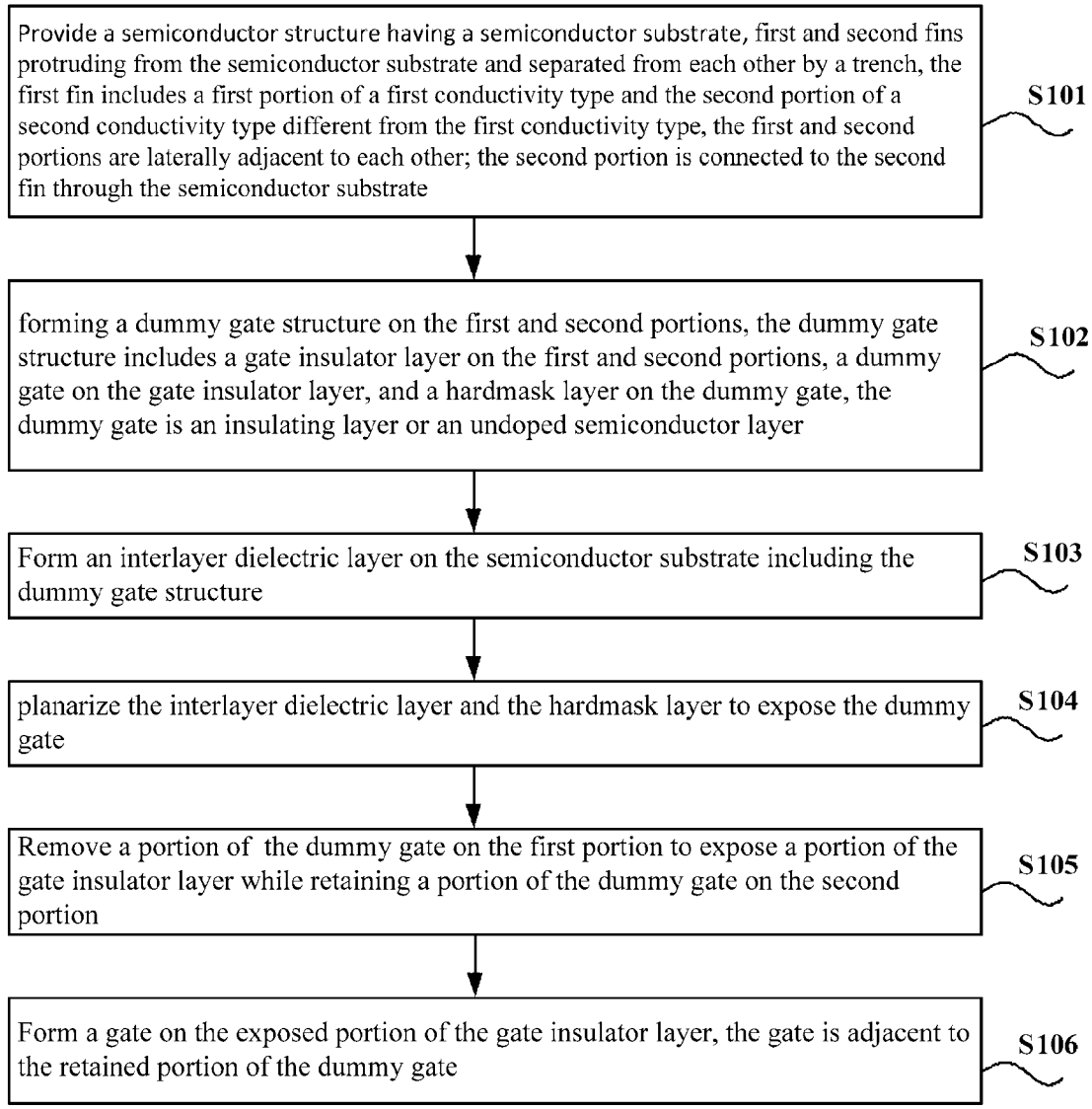
FIG. 1 is a flowchart of a method for manufacturing a semiconductor device according to some embodiments of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein.

The present inventors discovered that, in a conventional LDMOS device, a portion of a gate oxide and a portion of a metal gate are disposed on a shallow trench isolation (STI) region, the portion of the gate oxide on the STI region is also disposed between the metal gate and a drift region. During operation, the voltage difference between the metal gate and the drift region would tend to cause breakdown (puncture) to that portion of the gate oxide, limiting the source and drain breakdown performance of the LDMOS (especially LDNMOS) device.

FIG. 1 is a flowchart of a method for manufacturing a semiconductor device according to some embodiments of the present invention. FIGS. 2-6, 7A, and 8-12 are cross-sectional views illustrating intermediate stages of a semiconductor device manufactured with a method according to some embodiments of the present invention.

Referring to FIG. 1, the method may include the following process steps:

At S101: providing a semiconductor structure. The semiconductor structure includes a semiconductor substrate, a first fin and a second fin on the semiconductor substrate and separated by a trench. The first fin includes at least a first portion having a first conductivity type and a second portion having a second conductivity type that is different from the first conductivity type. The first and second portions are laterally adjacent to each other (first and second portions are abutting each other in the lateral direction). The second portion is connected to the second fin through the semiconductor substrate.

Figure 2:
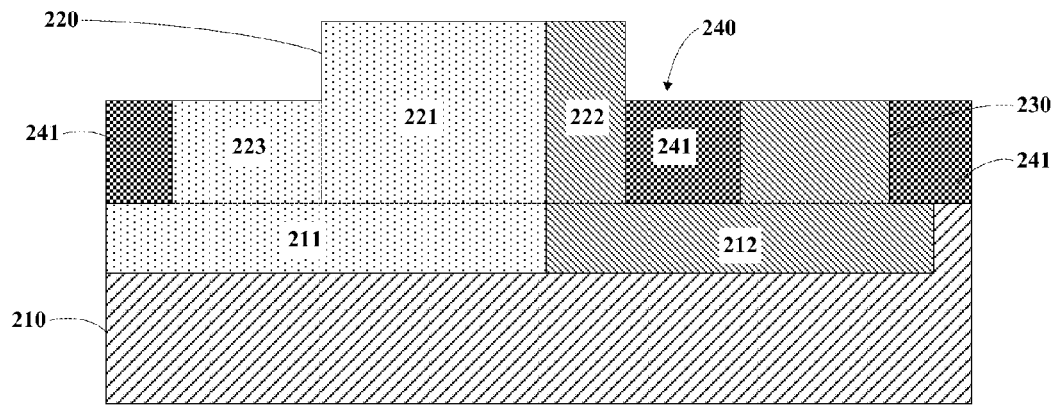
FIG. 2 is a cross-sectional view illustrating an intermediate stage of a semiconductor device manufactured with a method according to some embodiments of the present invention.

FIG. 2 is a cross-sectional view illustrating an intermediate stage of a semiconductor device according to S101. As shown in FIG. 2, a semiconductor structure 20 is provided. Semiconductor structure 20 may include a semiconductor substrate (e.g., a silicon substrate) 210. Semiconductor substrate 210 may include a first region 211 having a first conductivity type and a second region 212 having a second conductivity type. First region 211 is laterally adjacent to second region 212. The first conductivity type is different from the second conductivity type. For example, the first conductivity type is N-type, and the second conductivity type is P-type. Conversely, the first conductivity type is P-type, and the second conductivity type is N-type. Semiconductor substrate 210 may further include a first fin 220 and a second fin 230. First fin 220 includes at least a first portion 221 having the first conductivity type and a second portion 222 having the second conductivity type different from the first conductivity type. First portion 221 and second portion 222 are contiguous. Second portion 222 is connected to second fin 230 through semiconductor substrate 210. In one embodiment, the upper surface of first portion 221 is flush with the upper surface of second portion 222. In this embodiment, first fin 220 and second fin 230 may include silicon.

In one embodiment, referring to FIG. 2, first region 211 of the first conductivity type is disposed laterally adjacent to second region 212 of the second conductivity type. First portion 221 is disposed on first region 211. Second portion 222 is disposed on second region 212. Second fin 230 having the second conductivity type is disposed on second region 212.

In one embodiment, referring to FIG. 2, first fin 220 may further include a third portion 223 having the first conductivity type on first region 211. Third portion 223 is laterally adjacent to first portion 221. Third portion 223 has an upper surface that is lower than an upper surface of first portion 221.

In one embodiment, still referring to FIG. 2, semiconductor structure 20 further includes a first insulator layer 241 filling at least trench 240. First insulator layer 241 may include silicon dioxide. In some embodiments, one or more trenches may be formed around first fin 220 and second fin 230. The one or more trenches may be fileld with first insulator layer 241.

Referring back to FIG. 1, at S102, the method may further include forming a dummy gate structure on the first portion and on the second portion. The dummy gate structure includes a gate insulator layer on at least the first portion and second portion, a dummy gate on the gate insulator layer, and a hardmask layer on the dummy gate. The dummy gate is an insulating layer or an undoped semiconductor layer.

Figure 3:
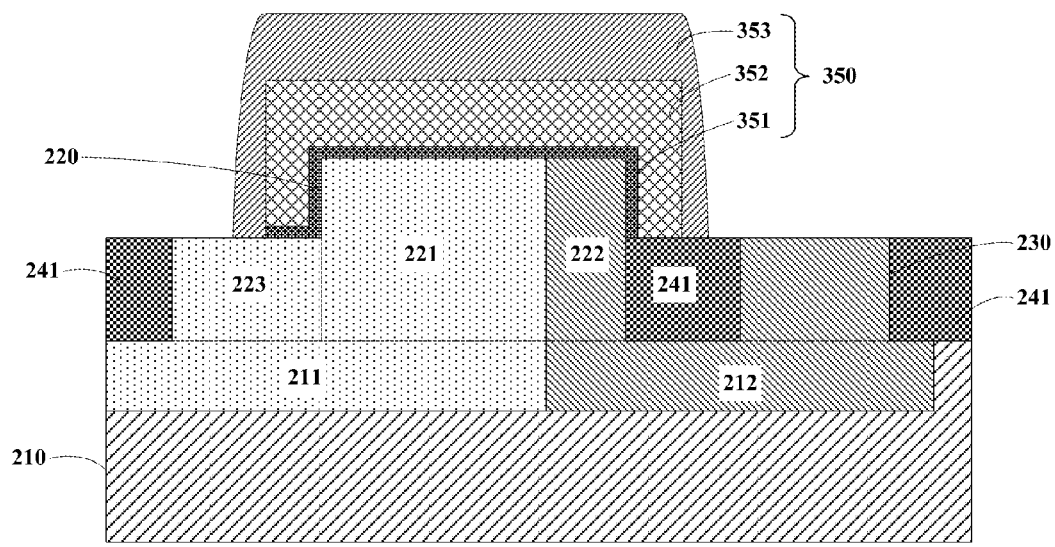
FIG. 3 is a cross-sectional view illustrating an intermediate stage of a semiconductor device manufactured with a method according to some embodiments of the present invention.

FIG. 3 is a cross-sectional view illustrating an intermediate stage of a semiconductor device according to S102. As shown in FIG. 3, a dummy gate structure 350 is formed on first portion 221 and second portion 222. Dummy gate structure 350 includes a gate insulator layer 351 on first portion 221 and second portion 222, a dummy gate 352 on gate insulator layer 351, and a hardmask layer 353 on dummy gate 352. Dummy gate 352 may be an insulating layer or an undoped semiconductor layer. For example, dummy gate 352 may include undoped polysilicon or amorphous silicon. In a preferred embodiment, the dummy gate may include undoped amorphous silicon. Hardmask layer 353 may include silicon nitride.

In one embodiment, gate insulator layer 351 may include a silicon dioxide layer on first portion 221 and second portion 222. In another embodiment, gate insulator layer 351 may include a silicon dioxide layer on first portion 221 and second portion 222 and a high-k dielectric layer on the silicon dioxide layer. The high-k dielectric layer may extend onto first insulator layer 241 that is disposed between first fin 220 and second fin 230. In an example embodiment, the high-k dielectric layer may include hafnium oxide ($HfO_2$), zirconium dioxide, or titanium dioxide.

It should be noted that, herein, although gate insulator layer 351 shown in FIG. 3 does not extend onto first insulator layer 241, those of skill in the art will appreciate that the gate insulator layer may extend into the first insulator layer. Of course, it is understood that the gate insulator layer structure shown in FIG. 3 may be formed without extending over the first insulator layer. In the description of subsequent manufacturing processes, the gate insulator layer is shown as not extending over the first insulator layer in the cross-sectional view.

In one embodiment, at S102, referring to FIG. 3, gate insulator layer 351 may also be formed on a portion of the surface of third portion 223. Dummy gate 352 may also be formed on a portion of the surface of gate insulator layer 351 on third portion 223. Dummy gate structure 350 may have a first distal end on third portion 223 and a second distal end on first insulator layer 241. In one embodiment, dummy gate structure 350 covers a portion of third portion 223, as shown in FIG. 3.

Referring back to FIG. 1, at S103, the method may further include, after forming the dummy gate structure, forming an interlayer dielectric layer on the semiconductor structure.

Figure 5:
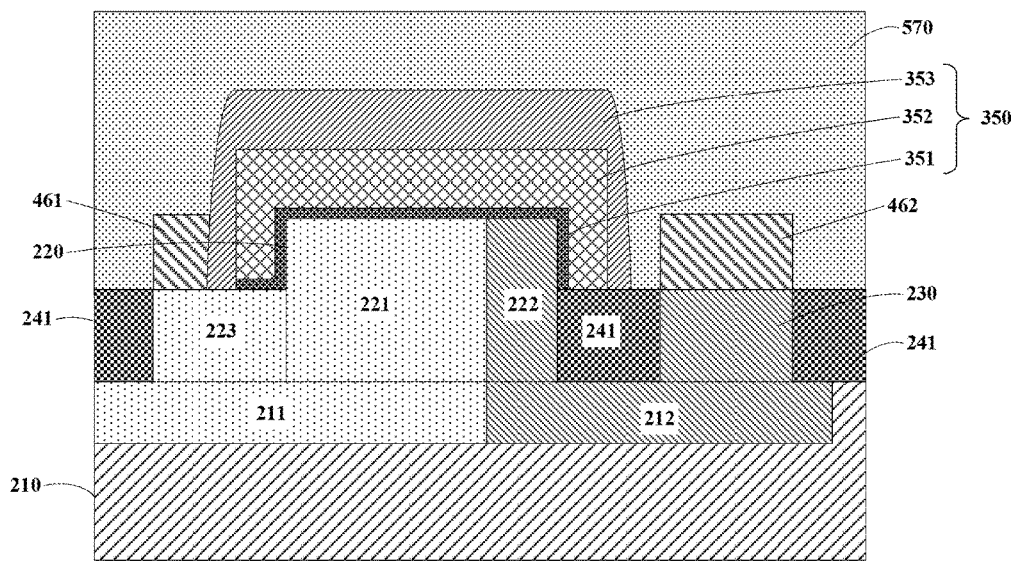
FIG. 5 is a cross-sectional view illustrating an intermediate stage of a semiconductor device manufactured with a method according to some embodiments of the present invention.

FIG. 5 is a cross-sectional view illustrating an intermediate stage of a semiconductor device according to S103. As shown in FIG. 5, an interlayer dielectric layer 570 is formed on the semiconductor structure (e.g., using a deposition process), after forming the dummy gate structure. In an embodiment, the interlayer dielectric layer includes silicon dioxide.

Figure 4:
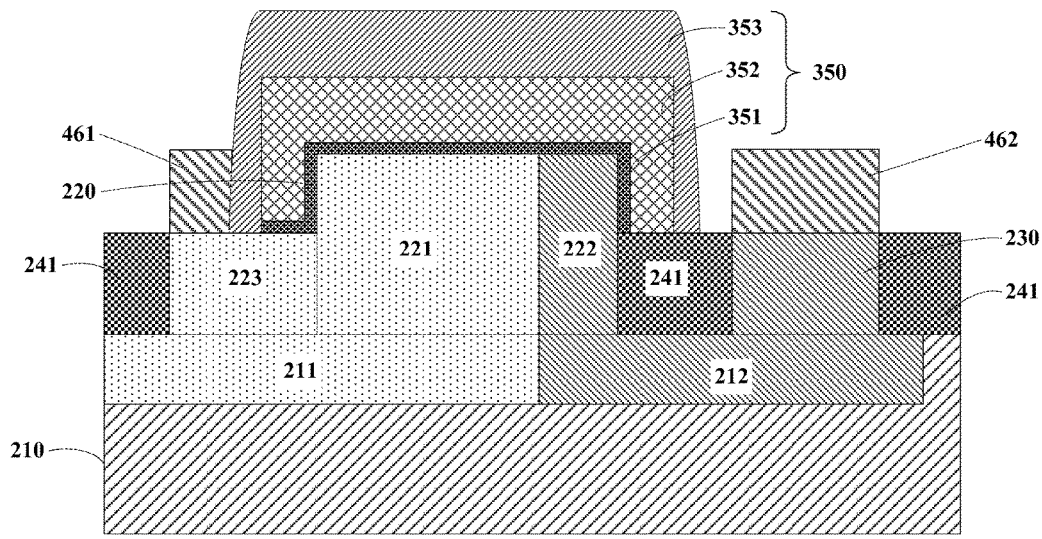
FIG. 4 is a cross-sectional view illustrating an intermediate stage of a semiconductor device manufactured with a method according to some embodiments of the present invention.

In one embodiment, before forming interlayer dielectric layer 570, the method may also include forming a source 461 on a surface portion of third portion 223 that has not been covered by dummy gate structure 350 and a drain 462 on second fin 230, as shown in FIG. 4. After the formation of the interlayer dielectric layer, interlayer dielectric layer 570 may cover source 461 and drain 462, as shown in FIG. 5.

Referring back to FIG. 1, at S104, the method may further include performing a planarization process on the interlayer dielectric layer and the hardmask layer to expose a surface of the dummy gate.

Figure 6:
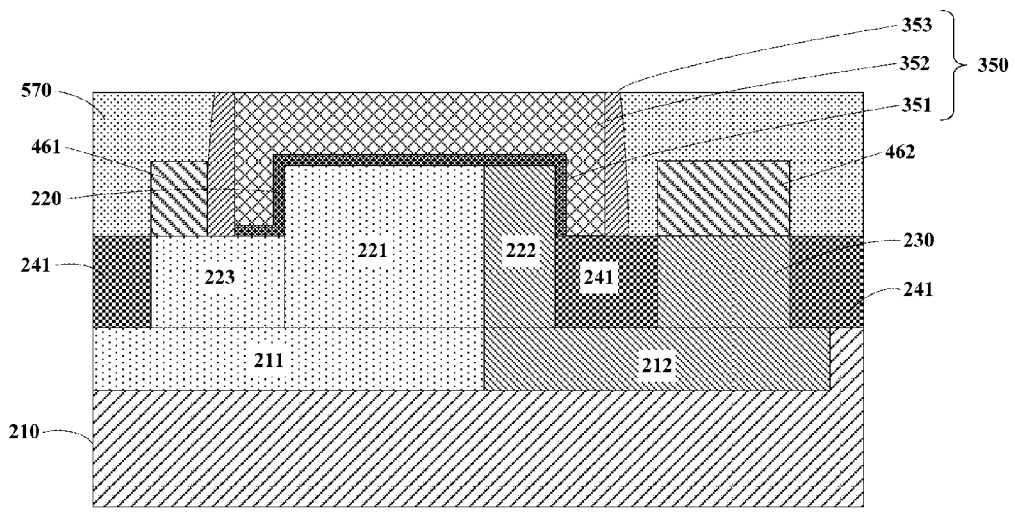
FIG. 6 is a cross-sectional view illustrating an intermediate stage of a semiconductor device manufactured with a method according to some embodiments of the present invention.

FIG. 6 is a cross-sectional view illustrating an intermediate stage of a semiconductor device according to S104. As shown in FIG. 6, a planarization (e.g., chemical mechanical polishing) process is performed on interlayer dielectric layer 570 and hardmask layer 353 to expose a surface of dummy gate 352.

Referring back to FIG. 1, at S105, the method may further include removing a portion of the dummy gate on the first portion while keeping a portion of the dummy gate on the second portion.

Figure 7A:
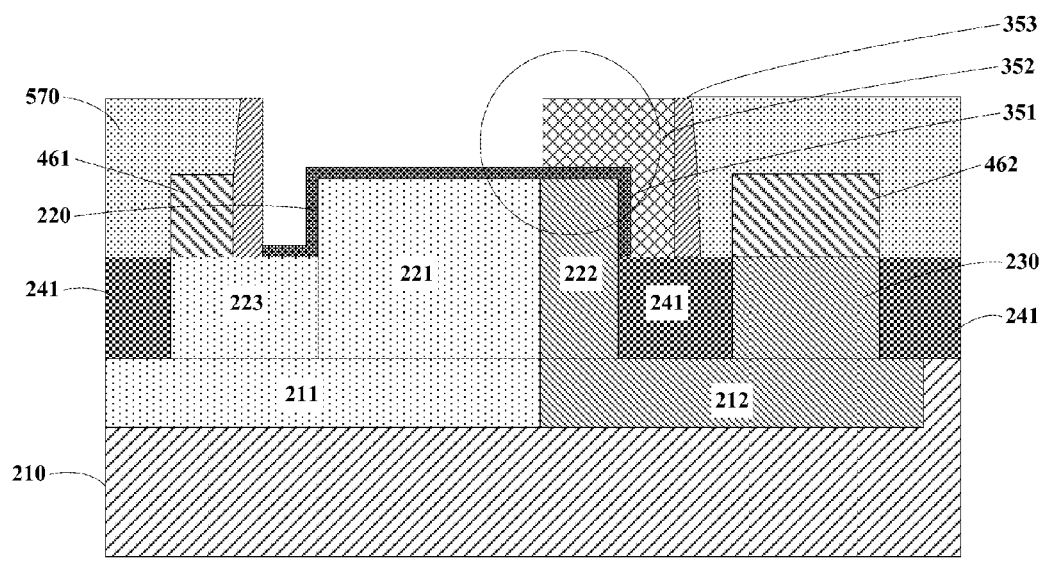
FIG. 7A is a cross-sectional view illustrating an intermediate stage of a semiconductor device manufactured with a method according to some embodiments of the present invention.

FIG. 7A is a cross-sectional view illustrating an intermediate stage of a semiconductor device according to S105. As shown in FIG. 7A, a portion of dummy gate 352 on first portion 221 is removed to expose a portion of gate insulator layer 351 and a portion of dummy gate 352 on second portion 222 is not removed. In one embodiment, at S105, a portion of dummy gate 352 on third portion 223 is also removed, as shown in FIG. 7A.

Figure 7B:
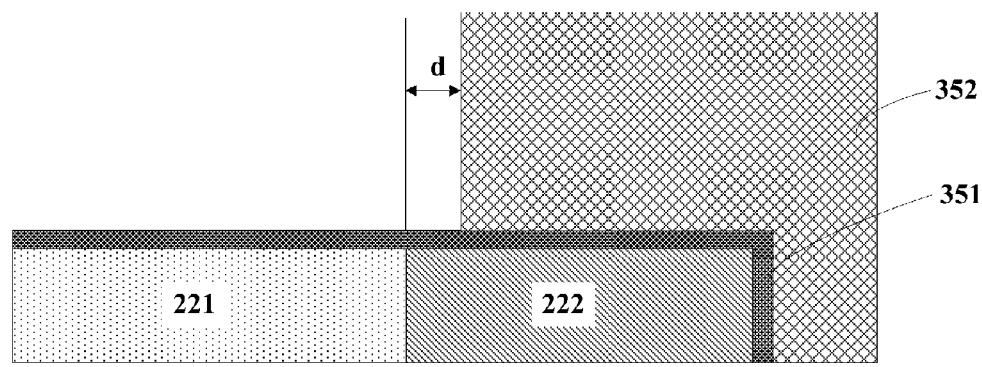
FIG. 7B is an enlarged view of a portion indicated by a circle in FIG. 7A.

FIG. 7B is an enlarged view of a portion indicated by a circle in FIG. 7A. In one embodiment, at S105, the method may also include removing a portion of dummy gate 352 disposed on second portion 222. In one embodiment, the lateral distance "d" between a retained portion of dummy gate 352 and a closest edge of first portion 221 may be in the range between 0 and 100 nm, e.g., 20 nm, 30 nm, 50 nm, etc. In a preferred embodiment, the lateral distance d is 0 nm, i.e., the retained portion of dummy gate 352 on second portion 222 is aligned with the closest edge of first portion 221.

The process S105 will be described in detail below with reference to FIGS. 9, 10, and 7A.

Figure 9:
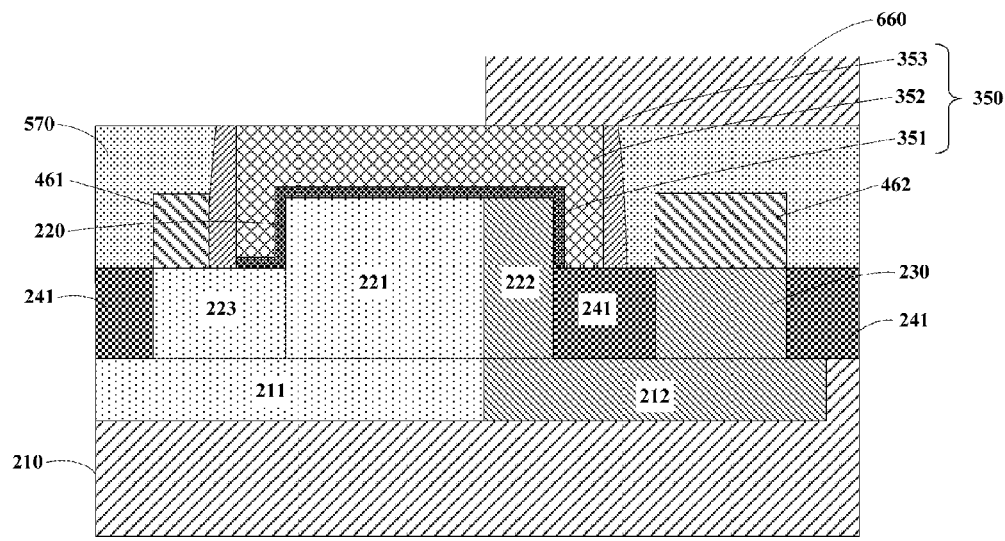
FIG. 9 is a cross-sectional view illustrating an intermediate stage of a semiconductor device manufactured with a method according to some embodiments of the present invention.

In one embodiment, the process S105 may include forming a patterned first mask layer (e.g., photoresist) 660 on interlayer dielectric layer 570 and a portion of dummy gate 352 while exposing a portion of dummy gate 352 on first portion 221, as shown in FIG. 9. In one embodiment, patterned first mask layer 660 also exposes a portion of dummy gate 352 on third portion 223. Optionally, patterned first mask layer 660 further exposes a portion of interlayer dielectric layer 570 and a portion of hardmask layer 353.

Figure 10:
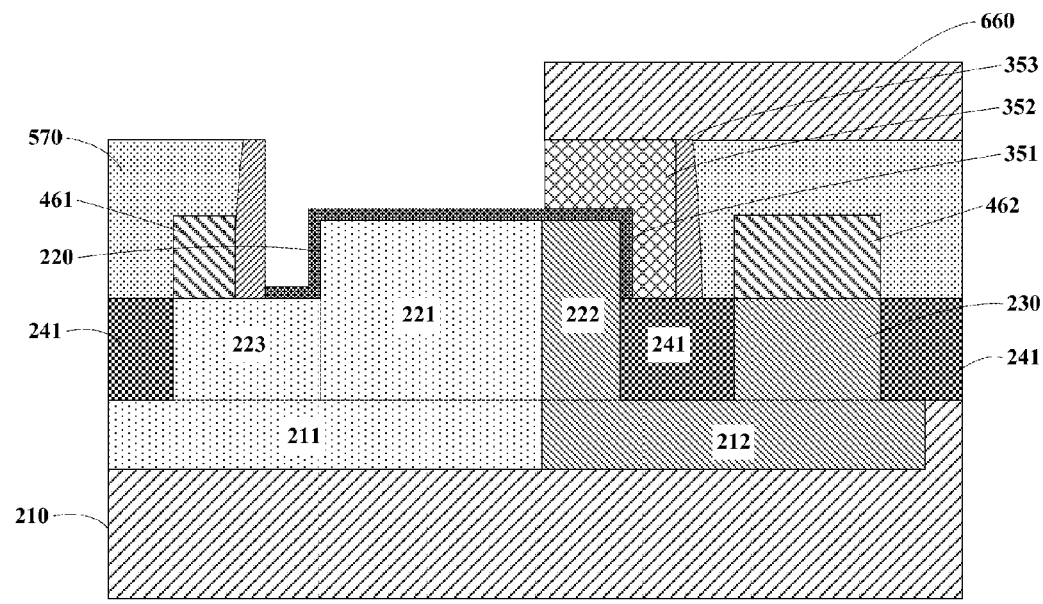
FIG. 10 is a cross-sectional view illustrating an intermediate stage of a semiconductor device manufactured with a method according to some embodiments of the present invention.

In one embodiment, the process S105 may also include removing the exposed portion of dummy gate 352 using patterned first mask layer 660 as a mask, as shown in FIG. 10.

In one embodiment, the process S105 may further include removing patterned first mask layer 660 to form the structure as shown in FIG. 7A.

Referring back to FIG. 1, at S106, the method may further include forming a gate on the exposed the portion of gate insulator layer, the gate is adjacent to the retained portion of the dummy gate.

Figure 8:
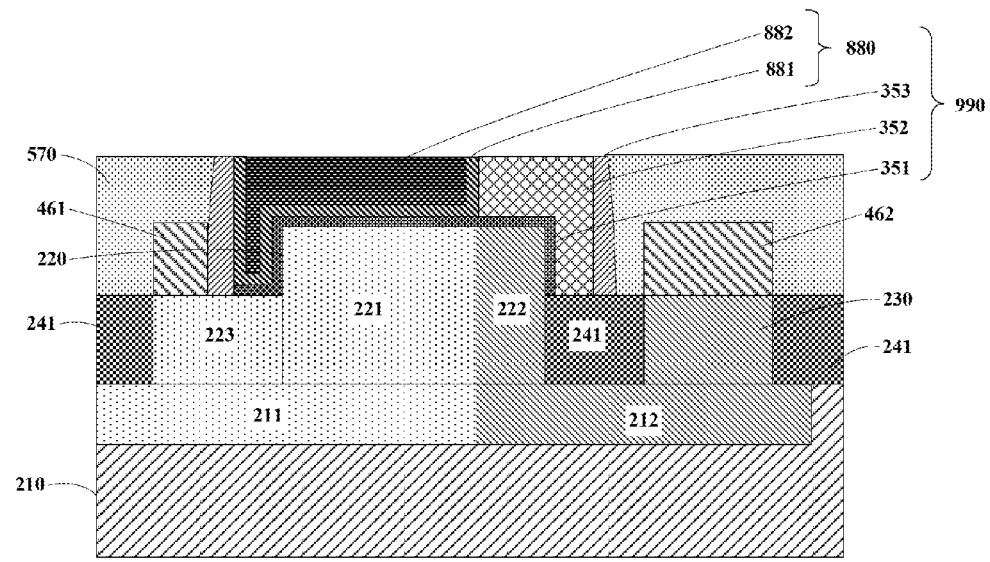
FIG. 8 is a cross-sectional view illustrating an intermediate stage of a semiconductor device manufactured with a method according to some embodiments of the present invention.

FIG. 8 is a cross-sectional view illustrating an intermediate stage of a semiconductor device according to S106. As shown in FIG. 8, a gate 880 is formed on the exposed portion of gate insulator layer 351. Gate 880 is adjacent to the retained portion of dummy gate 352, In one embodiment, gate 880 may include a work function adjusting layer 881 disposed on an exposed portion of gate insulator layer 351 and a conductive material layer 882 on work function adjusting layer 881. The conductive material layer may include a metal such as tungsten.

In one embodiment, the first conductivity type is P-type, and the second conductivity type is N-type. Work function adjusting layer 881 is an N-type work function adjusting layer. For example, the N-type work function adjusting layer may include titanium aluminum alloy (TiAl). In another embodiment, the first conductivity type is N-type, and the second conductivity type is P-type. Work function adjusting layer 881 is a P-type work function adjusting layer. For example, the P-type work function adjusting layer may include titanium nitride (TiN) or tantalum nitride (TaN).

The process S106 will be described in detail below with reference to FIGS. 11, 12, and 8.

Figure 11:
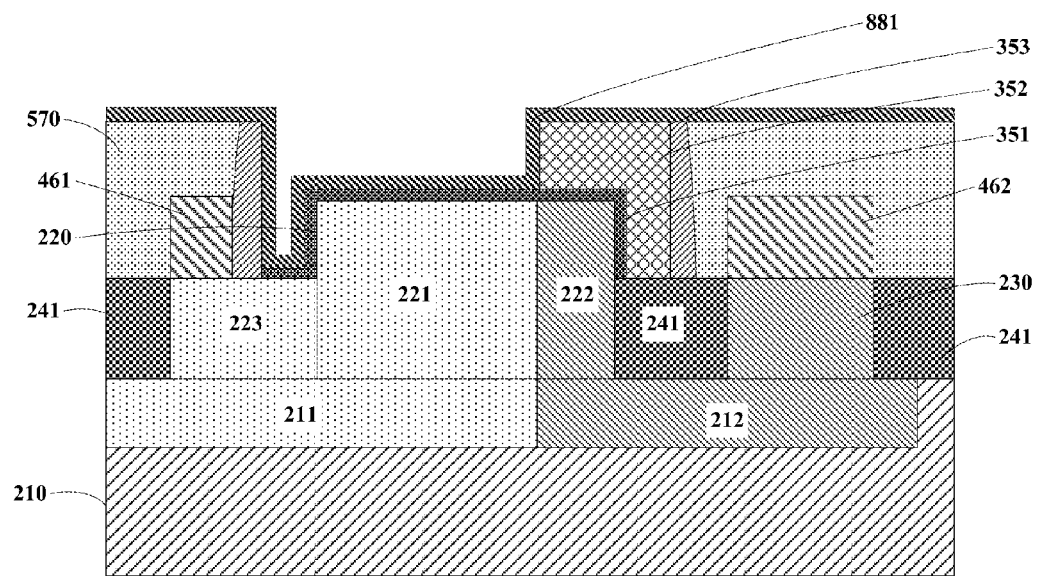
FIG. 11 is a cross-sectional view illustrating an intermediate stage of a semiconductor device manufactured with a method according to some embodiments of the present invention.

In one embodiment, the process S106 may include forming work function adjusting layer 881 using a deposition process on interlayer dielectric layer 570, on a portion of an inner wall of hardmask layer 353, a portion of gate insulator layer 351, and a portion of dummy gate on second portion 222, as shown in FIG. 11

Figure 12:
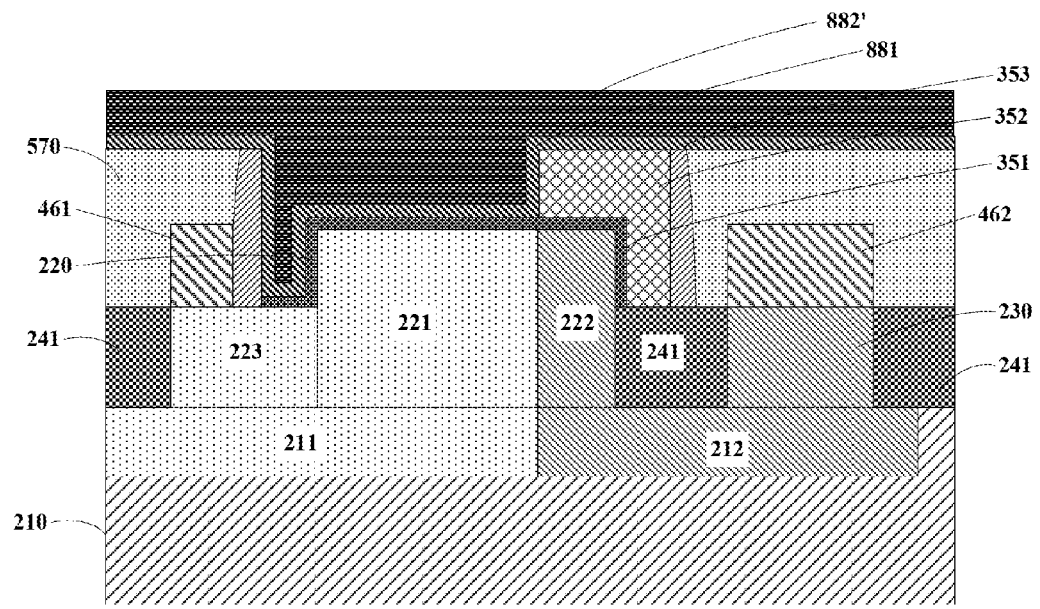
FIG. 12 is a cross-sectional view illustrating an intermediate stage of a semiconductor device manufactured with a method according to some embodiments of the present invention.

In one embodiment, the process S106 may also include forming a conductive material layer 882' on work function adjusting layer 881 using a deposition process, as shown in FIG. 12.

In one embodiment, the process S106 may further include planarizing (e.g., chemical mechanical polishing) conductive material layer 881' until a surface of interlayer dielectric layer 570 is exposed, as shown in FIG. 8.

Thus, the above described steps provide a method of manufacturing a semiconductor device according to some embodiments of the present invention. Referring to FIG. 8, the semiconductor device thus manufactured may include a semiconductor substrate (e.g., silicon substrate) 210, a first fin 220 and a second fin 230 on semiconductor substrate 210 and separated from each other by a trench. First fin 220 includes at least a first portion 221 having a first conductivity type and a second portion 222 having a second conductivity type different from the first conductivity type. First portion 221 and second portion 222 are contiguous (adjacent to each other). In one embodiment, the upper surface of first portion 221 is flush with the upper surface of second portion 222. Second portion 222 is connected to second fin through semiconductor substrate. In one embodiment, the first conductivity type is N-type, and the second conductivity type is P-type.

The semiconductor device may also include a gate structure 990 on first portion 221 and second portion 222. Gate structure 990 may include a gate insulator layer 351 on at least a portion of first portion 221 and second portion 222, a gate 880 on at least a portion of gate insulator layer 351 on first portion 221, and a dummy gate 352 on a portion of gate insulator layer 351 on second portion 222. Dummy gate 352 is adjacent to gate 880. Dummy gate 352 may include an insulating layer or an undoped semiconductor layer. For example, dummy gate 352 may include undoped polysilicon or amorphous silicon. In a preferred embodiment, the dummy gate may include undoped amorphous silicon.

In the embodiment, the first portion is disposed in a diffusion region, the second portion is disposed in a drift region. The gate is formed on the first portion, the dummy gate is formed on the second portion. Due to the insulation of the dummy gate, the portion of the gate insulator layer on first insulator layer 241 and between second portion 222 and dummy gate 352 ca be made to be less likely to be punctured, so that the breakdown possibility of the gate insulator layer can be reduced, and the device reliability can be improved.

In one embodiment, the lateral distance between dummy gate 353 and the closest edge of first portion 221 is in the range between 0 nm and 100 nm, e.g., 20 nm, 30 nm, 50 nm, etc.

In one embodiment, referring to FIG. 8, semiconductor substrate 210 may include a first region 211 having the first conductivity type and a second region 212 having the second conductivity type. First and second regions 211 and 212 are adjacent to each other. First portion 221 is disposed on first region 211, and second portion 222 is disposed on second region 212. Second fin 230 having the second conductivity type is disposed on second region 212.

In one embodiment, referring to FIG. 8, first fin 220 may also include a third portion 223 having the first conductivity type on first region 211. First and third portions 221 and 223 are adjacent to each other. Third portion 223 has an upper surface that is lower than the upper surface of first portion 221. Gate insulator layer 351 is disposed on a portion of the surface of third portion 223. Gate 880 is also disposed on a portion of the surface of gate insulator layer 351 on third portion 223.

In one embodiment, referring to FIG. 8, the semiconductor device may further include a first insulator layer 241 filling at least a portion of the trench. Gate structure 990 has a first distal end on third portion 223 and a second distal end on first insulator layer 241. First insulator layer 241 may include silicon dioxide.

In one embodiment, referring to FIG. 8, gate structure 990 may further include a hardmask layer 353 having a first portion on a side surface of gate 880 on third portion 223 and a second portion on a side surface of dummy gate 352 on first insulator layer 241. Hardmask layer 353 may include silicon nitride.

In one embodiment, referring to FIG. 8, the semiconductor device may further include a source 461 on third portion 223 and a drain 462 on second fin 230. The first portion of hardmask layer 353 is disposed between source 461 and gate 880, the second portion of hardmask layer 353 is disposed between drain 462 and dummy gate 352.

In one embodiment, referring to FIG. 8, gate 880 may include a work function adjusting layer 881 on a portion of gate insulator layer 351 and a conductive material layer 882 on work function adjusting layer 881. In an example embodiment, the conductive material layer may include a metal such as tungsten.

In one embodiment, the first conductivity type is P-type, and the second conductivity type is N-type. The work function adjusting layer is an N-type work function adjusting layer. In an example embodiment, the work function adjusting layer may include titanium aluminum alloy (TiAl).

In another embodiment, the first conductivity type is N-type, and the second conductivity type is P-type. The work function adjusting layer is a P-type work function adjusting layer. In an example embodiment, the work function adjusting layer may include titanium nitrite (TiN) or tantalum nitride (TaN).

In one embodiment, referring to FIG. 8, the semiconductor device may further include an interlayer dielectric layer 570 surrounding gate structure 990 and covering source 461 and drain 462. In an example embodiment, the interlayer dielectric layer includes silicon dioxide.

In some embodiments of the present invention, first region 211 of the first conductivity type, first portion 221 and third portion 223 may serve as a diffusion region of the semiconductor device, a second portion 222 of the second conductivity type and second fin 230 may serve as a drift region of the semiconductor device. The gate is formed on first portion 221 and third portion 223, the dummy gate is formed on second portion 222. The dummy gate may be an insulating layer or an undoped semiconductor layer and may serve as an insulation, so that puncture damage in portions of the gate insulator layer on first insulator layer 241 and between second portion 222 and dummy gate 352 can be prevented, and reduce gate insulator layer breakdown to further improve the device reliability.

Thus, embodiments of the present invention provide detailed description of a method of manufacturing a semiconductor device and a semiconductor device manufactured using the described method. In the description, numerous specific details such as formation of fins, source, drain, trenches, and the like have not been described in detail in order not to obscure the embodiments of the invention.

References in the specification to "one embodiment", "an embodiment", "an example embodiment" "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A semiconductor device, comprising:
   a semiconductor substrate;
   first and second fins on the semiconductor substrate and separated by a trench, the first fin comprising a first portion including a first conductivity type and a second portion including a second conductivity type different from the first conductivity type, the first and second portions adjacent to each other, the second portion connected to the second fin through the semiconductor substrate;
   a gate structure on the first and second portions, the gate structure comprising:
   a gate insulator layer on the first and second portions;
   a gate on a portion of the gate insulator layer on the first portion; and
   a dummy gate on the second portion and comprising an insulating layer or an undoped semiconductor layer, the dummy gate being adjacent to the gate.

2. The semiconductor device of claim 1, wherein the dummy gate comprises undoped polycrystalline or amorphous silicon.

3. The semiconductor device of claim 1, wherein a lateral distance between the dummy gate and a closest edge of the first portion is in a range between 0 nm and 100 nm.

4. The semiconductor device of claim 1, wherein the first portion has an upper surface that is flush with an upper surface of the second portion.

5. The semiconductor device of claim 1, wherein the semiconductor substrate comprises a first region having the first conductivity type and a second region having the second conductivity type, the first fin is on the first region, and the second fin is on the second region.

6. The semiconductor device of claim 5, wherein the first fin comprises a third portion having the first conductivity type on the first region, the third portion being adjacent to the first portion and having an upper surface lower than upper surface of the first portion, the gate insulator layer on a portion of the third portion, and the gate on a portion of the gate insulator layer on the third portion.

7. The semiconductor device of claim 6, further comprising a first insulator layer filling at least a portion of the trench, wherein the gate structure has a first end on the third portion and a second end on the first insulator layer.

8. The semiconductor device of claim 7, wherein the gate structure further comprises a hardmask layer having a first portion on a side surface of the gate on the third portion and a second portion on a side surface of the dummy gate on the first insulator layer.

9. The semiconductor device of claim 8, further comprising a source on the third portion and a drain on the second fin, wherein the first portion of the hardmask layer is disposed between the source and the gate and the second portion of the hardmask layer is disposed between the drain and the dummy gate.

10. The semiconductor device of claim 1, wherein the gate comprises a work function adjusting layer on a portion of the gate insulator layer and a conductive material layer on the work function adjusting layer.

11. The semiconductor device of claim 10, wherein the first conductivity type is P-type, the second conductivity type is N-type, the work function adjusting layer is an N-type work function adjusting layer; or
   the first conductivity type is N-type, the second conductivity type is P-type, the work function adjusting layer is a P-type work function adjusting layer.

12. The semiconductor device of claim 11, wherein the N-type work function adjusting layer comprises a titanium aluminum alloy; the P-type work function adjusting layer comprises titanium nitrite or tantalum nitride.

13. The semiconductor device of claim 9, further comprising an interlayer dielectric layer surrounding the gate structure and covering the source and drain.

14. A semiconductor device, comprising:
   a semiconductor substrate;
   first and second fins on the semiconductor substrate and separated by a trench, the first fin comprising a first portion including a first conductivity type and a second portion including a second conductivity type different from the first conductivity type, the first and second portions adjacent to each other, the second portion connected to the second fin through the semiconductor substrate;
   a gate structure having a gate insulator layer on the first and second portions and a dummy gate on a portion of the gate insulator layer on the second portion; and
   a gate on a portion of the gate insulator layer on the first portion but not on the second portion, the gate being adjacent to the dummy gate.

15. The semiconductor device of claim 14, wherein the semiconductor substrate comprises a first region having the first conductivity type and a second region having the second conductivity type, the first fin is on the first region, and the second fin is on the second region.

16. The semiconductor device of claim 15, wherein the first fin comprises a third portion having the first conductivity type on the first region, the third portion being adjacent to the first portion and having an upper surface lower than upper surface of the first portion, the gate insulator layer on a portion of the third portion, and the gate on a portion of the gate insulator layer on the third portion.

17. The semiconductor device of claim 16, further comprising a first insulator layer filling at least a portion of the trench, wherein the gate structure has a first end on the third portion and a second end on the first insulator layer.

18. The semiconductor device of claim 17, wherein the gate structure further comprises a hardmask layer having a first portion on a side surface of the gate on the third portion and a second portion on a side surface of the dummy gate on the first insulator layer.

19. The semiconductor device of claim 18, further comprising a source on the third portion and a drain on the second fin, wherein the first portion of the hardmask layer is disposed between the source and the gate and the second portion of the hardmask layer is disposed between the drain and the dummy gate.

20. The semiconductor device of claim 19, further comprising an interlayer dielectric layer surrounding the gate structure and covering the source and drain.

\* \* \* \* \*